United States Patent [19]
Nakajoh et al.

[11] Patent Number: 6,094,354
[45] Date of Patent: Jul. 25, 2000

[54] CHIP COMPONENT MOUNTING BOARD, CHIP COMPONENT MOUNTING STRUCTURE, AND METHOD OF MANUFACTURING CHIP COMPONENT MOUNTING BOARD

[75] Inventors: Toshiaki Nakajoh; Kenichi Tokuno, both of Tokyo, Japan

[73] Assignee: NEC Corporation, Tokyo, Japan

[21] Appl. No.: 08/980,914

[22] Filed: Dec. 1, 1997

[30] Foreign Application Priority Data

Dec. 3, 1996 [JP] Japan ................................. 8-322831
Dec. 12, 1996 [JP] Japan ................................. 8-332205

[51] Int. Cl.⁷ ............................................. H05K 7/02
[52] U.S. Cl. ........................ 361/760; 361/807; 361/808; 361/812; 361/764; 361/765; 361/768; 264/272.11; 264/272.17; 174/52.2; 174/52.3; 257/737; 257/787; 257/788; 257/789; 257/791; 257/778
[58] Field of Search .................................. 361/760, 807, 361/808, 812, 764, 765, 768; 264/272.11, 272.17; 257/737, 787, 788, 789, 791, 782, 778; 174/52.2, 52.3

[56] References Cited

U.S. PATENT DOCUMENTS

| | | | |
|---|---|---|---|
| 5,399,805 | 3/1995 | Tyler et al. | 174/52.4 |
| 5,424,251 | 6/1995 | Sono et al. | 438/127 |
| 5,570,272 | 10/1996 | Variot | 361/723 |
| 5,780,776 | 7/1998 | Noda | 174/255 |
| 5,846,477 | 12/1998 | Hotta et al. | 264/511 |
| 5,864,178 | 1/1999 | Yamada et al. | 257/737 |

FOREIGN PATENT DOCUMENTS

| | | |
|---|---|---|
| 58-50572 | 3/1983 | Japan . |
| 61-271847 | 12/1986 | Japan . |
| 62-30353 | 2/1987 | Japan . |
| 63-4690 | 1/1988 | Japan . |
| 63-51449 | 4/1988 | Japan . |
| 63-173092 | 7/1988 | Japan . |
| 63-241955 | 10/1988 | Japan . |
| 1-191457 | 8/1989 | Japan . |
| 2-96343 | 4/1990 | Japan . |
| 2-99649 | 8/1990 | Japan . |
| 5-90438 | 4/1993 | Japan . |
| 5-38898 | 5/1993 | Japan . |
| 5-299469 | 11/1993 | Japan . |
| 6-53348 | 2/1994 | Japan . |
| 6-112599 | 4/1994 | Japan . |
| 6-244302 | 9/1994 | Japan . |
| 6-244307 | 9/1994 | Japan . |
| 6-326154 | 11/1994 | Japan . |
| 6-349969 | 12/1994 | Japan . |
| 8-195414 | 7/1996 | Japan . |

OTHER PUBLICATIONS

"Technique of Mounting Flip Chip on Printed Wiring Board" (Semiconductor World, Special Edition, pp. 139–144, 1993).

"High–density Printed Wiring Board for Portable Device of Next Generation", (Nikkei Electronics, No. 633, pp. 99–116, Apr. 1995).

*Primary Examiner*—Leo P. Picard
*Assistant Examiner*—David Foster
*Attorney, Agent, or Firm*—Whitham, Curtis & Whitham

[57] ABSTRACT

A chip component mounting board includes a chip mounting portion and a first groove. A chip component is mounted on the chip mounting portion. The chip mounting portion has a connection pad electrically connected to the chip component. The first groove is formed in the chip mounting portion to extend from a center of the chip mounting portion to one side of the chip mounting portion while gradually increasing its width. A method of manufacturing a chip component mounting board is also disclosed.

16 Claims, 19 Drawing Sheets

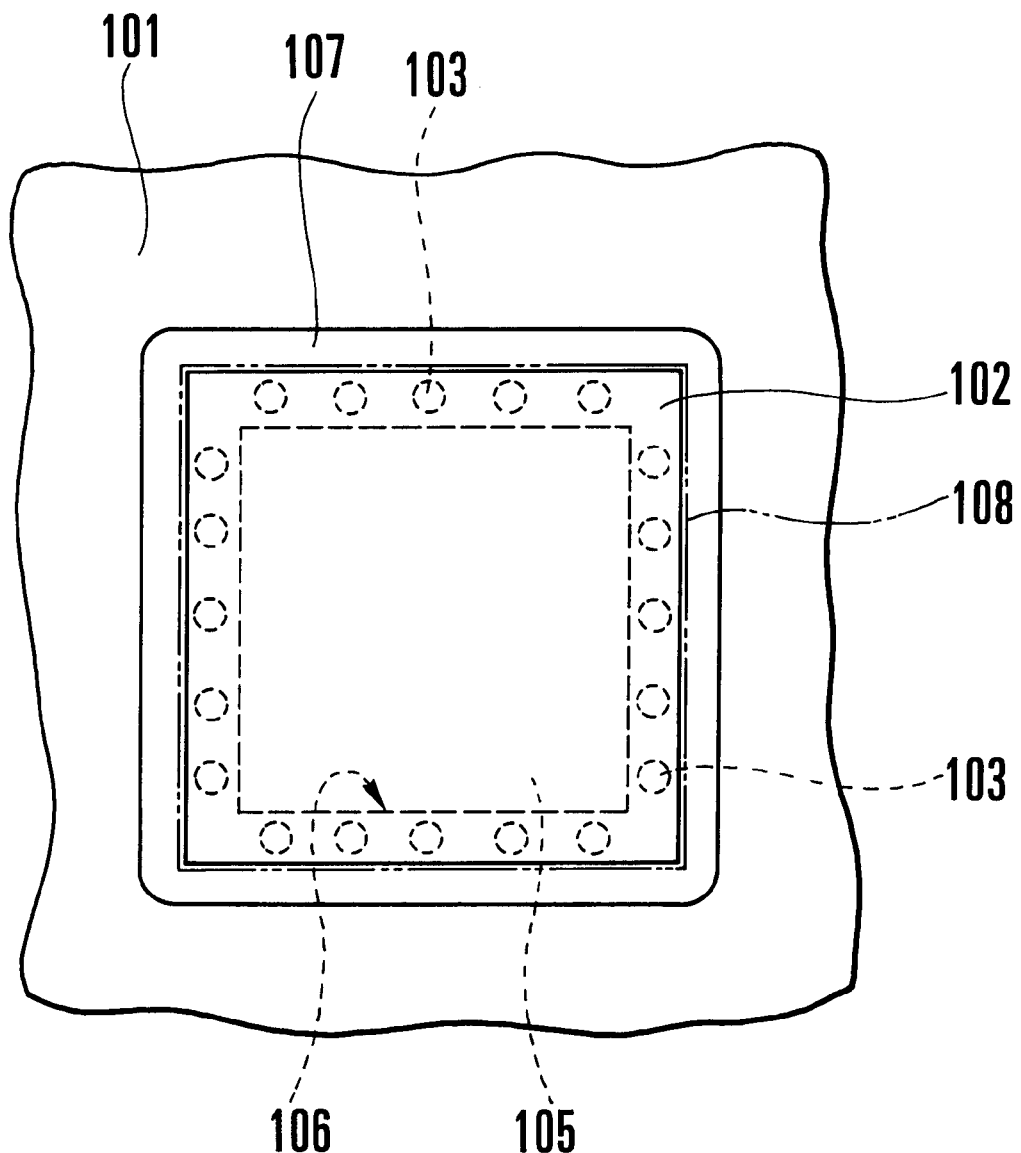
F I G. 6

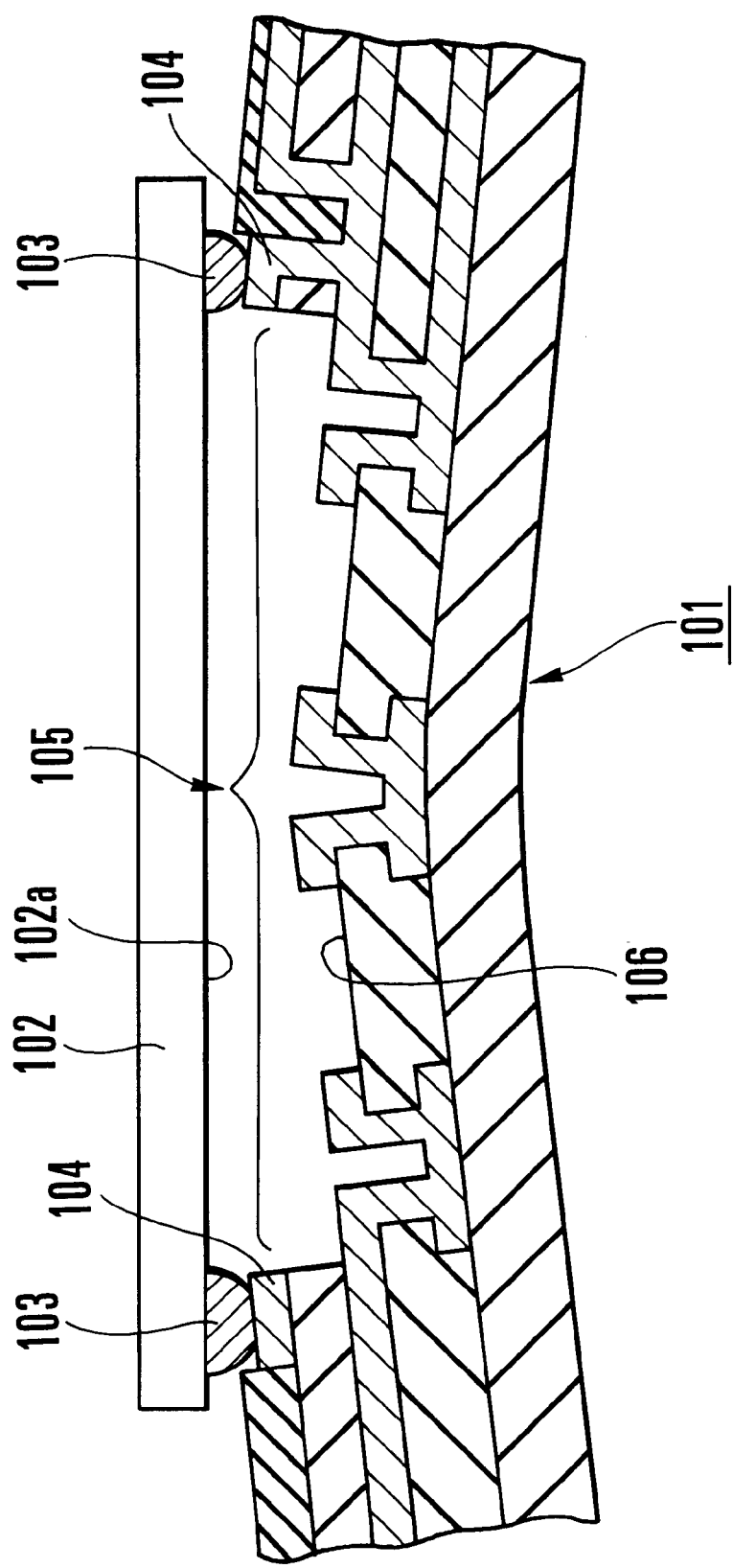

CHIP COMPONENT MOUNTING BOARD, CHIP COMPONENT MOUNTING STRUCTURE, AND METHOD OF MANUFACTURING CHIP COMPONENT MOUNTING BOARD

BACKGROUND OF THE INVENTION

The present invention relates to a technique of mounting a chip component on a wiring board and, more particularly, to a chip component mounting board on which a chip component is to be mounted, a chip component mounting structure, and a method of manufacturing the chip component mounting board.

In recent years, various techniques of directly mounting a semiconductor chip on a board have been developed to realize ultra-high-density mounting of devices. Of these techniques, bare chip mounting is known as a technique having a lot of advantages such as ultra-low-profile mounting depending on only the board thickness and the semiconductor chip thickness, a small mounting area depending on only the semiconductor chip size, and excellent electrical characteristics due to the shortest connection. Examples of the bare chip mounting technique are flip chip mounting in which solder bumps are formed on the electrodes of a bare chip, and the bare chip with its wiring surface facing downward is mounted on the wiring board, and beam lead chip mounting using beam leads of gold or platinum in place of bumps.

In the above-described flip chip mounting, generally, after the bare chip is mounted on the wiring board, a resin is injected into a gap between the bare chip and the wiring board and cured. When the resin is cured, the bare chip and the wiring board are integrated. The stress applied to the connection portion between the bare chip and the wiring board is dispersed, and airtightness to the outer atmosphere at the connection portion increases, resulting in high reliability.

As a method of injecting the resin into the gap between the bare chip and the wiring board, the resin is injected from the gaps at the four corners or four sides of the rectangular bare chip mounted on the wiring board such that the applied resin flows toward the center of the gap between the bare chip and the wiring board due to capillarity.

When the resin is to be injected from the gaps at the four corners or four sides of the rectangular bare chip, the resin spreads in a short time. However, the interface between the resin and the bare chip and that between the resin and the wiring board partially have portions where the resin does not spread. These portions where the resin does not spread are called voids.

If the resin is injected from not the four corners or four sides but two corners or two sides of the bare chip to prevent voids, a long time is required to spread the resin, so the injection time is prolonged. Conventionally, when the resin is to be injected in a short time while preventing voids, a bare chip mounting board as shown in FIGS. 18A and 18B is used.

FIG. 18A shows a conventional bare chip mounting board, and FIG. 18B shows a section taken along a line II—II in FIG. 18A. A bare chip mounting portion 31 indicated by an alternate long and two short dashed line in FIG. 18A is a virtual area where a bare chip is mounted. As shown in FIG. 18B, in the conventional bare chip mounting board, a plurality of board pads 24 to be connected to the bare chip are formed on a wiring board 30 in correspondence with the electrode positions of the bare chip, and a solder resist 22 is formed on the wiring board 30 having the board pads 24.

As shown in FIG. 18A, to connect each board pad 24 to a corresponding electrode of the bare chip, the solder resist 22 has four rectangular opening portions 21 which are parallel to the four sides of the bare chip mounting portion 31 in correspondence with the electrode positions of the bare chip. A through hole 23 through which the resin and air flow in resin injection is formed at the center of the bare chip mounting portion 31, as will be described later.

FIG. 19 shows a state wherein the bare chip is mounted on the bare chip mounting board shown in FIGS. 18A and 18B. As shown in FIG. 19, to mount a bare chip 26 on a bare chip mounting board 32, bumps 28 are formed on aluminum electrodes 27 of the bare chip 26, and the bare chip 26 with its upper surface facing downward is placed on the bare chip mounting board 32. After the bumps 28 and the board pads 24 are positioned, the bumps 28 are heated and fused.

When the temperature is reduced to harden the bumps 28, the bare chip 26 is bonded to the bare chip mounting board 32. After the bare chip 26 is mounted on the bare chip mounting board 32, a resin is pressurized and injected from the through hole 23 formed in the bare chip mounting board 32. FIG. 20 shows a state wherein the gap between the bare chip mounting board 32 and the bare chip 26 is filled with the resin.

To fill the gap between the bare chip mounting board 32 and the bare chip 26 with a resin 29, as shown in FIG. 20, another method may be used. In FIG. 20, the resin 29 is potted on the surface of the bare chip mounting board 32 on which the bare chip 26 is mounted. The interior of the structure is evacuated from the other surface of the bare chip mounting board 32, which is on the opposite side of the potting side, through the through hole 23 to draw by suction the resin 29 supplied to the bare chip 26 side and inject the resin 29 into the gap between the bare chip mounting board 32 and the bare chip 26.

With any method, the resin 29 can be pressurized and injected or drawn by suction using the through hole 23 and injected in a short time without generating any voids. The injected resin 29 is cured, so the bare chip mounting board 32 and the bare chip 26 are integrated.

However, according to the above-described method, since the through hole 23 is formed in the bare chip mounting board 32, the wiring arrangement on the bare chip mounting board 32 is restricted. In addition, the wiring space decreases, and the wiring efficiency lowers.

FIG. 21 shows another example of the conventional bare chip mounting board for flip chip mounting. Referring to FIG. 21, a bare chip mounting board (to be simply referred to as a board hereinafter) 41 has, on its insulating layer 41a, connection pads 44 connected to a wireless semiconductor chip (to be simply referred to as a semiconductor chip hereinafter) 42, i.e., a bare chip. The semiconductor chip 42 having a circuit device surface 42a facing downward is mounted on the board 41. At this time, the semiconductor chip 42 is connected to the connection pads 44 on the board 41 via solder bumps 43 formed on the circuit device surface 42a and having a height of 30 to 50 μm.

The gap between the board 41 and the semiconductor chip 42 is filled with a sealing resin 45 consisting of an epoxy resin. The sealing resin 45 is also applied around the semiconductor chip 42 to seal the circuit device surface 42a of the semiconductor chip 42.

Since the semiconductor chip 42 is encapsulated with the sealing resin 45, water can be prevented from reaching the circuit device surface 42a. When a stress due to thermal expansion is applied to the semiconductor chip 42, the stress is dispersed over the lower surface of the semiconductor chip 42 to reduce the stress per solder bump 43. With this structure, the humidity resistance of the semiconductor chip 42 and the connection strength between the board 41 and the semiconductor chip 42 increase.

In the above-described conventional bare chip mounting board, however, the gap between the board 41 and the semiconductor chip 42 is as small as 30 to 50 µm equal to the height of the solder bump 43. For this reason, if a circuit opposing portion 41b of the board 41, which opposes the circuit device surface 42a when the semiconductor chip 42 is connected to the connection pads 44, is warped to project upward, as shown in FIG. 22, the circuit device surface 42a of the semiconductor chip 42 may contact the surface of the board 41 in mounting the semiconductor chip 42 on the board 41 to destroy the circuit device of the semiconductor chip 42.

Even in use of a beam lead chip, the gap between the board 41 and the semiconductor chip 42 is small. In such a case, normally, destruction of the semiconductor chip 42 cannot be recognized until the operation confirmation process after the assembly of the board 41. Not only the semiconductor chip 42 but also the board 41 on which the semiconductor chip 42 is mounted is defective, resulting in a serious problem in production management.

In addition, injection of the sealing resin 45 takes a long time because of the small gap between the board 41 and the semiconductor chip 42. Furthermore, since the semiconductor chip 42 can hardly be uniformly encapsulated, bubbles may be formed in the sealing resin 45 to generate voids. If many voids are formed in the sealing resin 45, the humidity resistance and connection strength degrade. Use of an epoxy resin as the sealing resin 45 makes the above problem more serious because of the high viscosity of the epoxy resin.

Even when the gap between the board 41 and the semiconductor chip 42 is filled with the sealing resin 45, water from the semiconductor chip 42 side may permeate through the thin sealing resin 45 and reach the circuit device surface 42a of the semiconductor chip 42. Additionally, the connection strength between the semiconductor chip 42 and the board 41 is low.

SUMMARY OF THE INVENTION

It is an object of the present invention to provide a chip component mounting board and chip component mounting structure which prevent voids in the gap between a board and a chip component without lowering the wiring efficiency of the board, and a method of manufacturing the chip component mounting board.

It is another object of the present invention to provide a chip component mounting board and semiconductor chip structure which enable to inject a resin into the gap between a board and a bare chip in a short time, and a method of manufacturing the chip component mounting board.

It is still another object of the present invention to provide a chip component mounting board and chip component mounting structure which realize quick mounting of a semiconductor chip component on a board even when the board is warped, and a method of manufacturing the chip component mounting board.

It is still another object of the present invention to provide a semiconductor chip board and semiconductor chip structure which can improve the humidity resistance and connection strength after chip component mounting even when the board is warped, and a method of manufacturing the chip component mounting board.

In order to achieve the above objects, according to the present invention, there is provided a chip component mounting board comprising a chip mounting portion on which a chip component is to be mounted, the chip mounting portion having a connection pad electrically connected to the chip component, and a first groove formed in the chip mounting portion to extend from a center of the chip mounting portion to one side of the chip mounting portion while gradually increasing a width.

BRIEF DESCRIPTION OF THE DRAWINGS

FIG. 6 is a plan view of the bare chip mounting board shown in FIG. 5;

FIG. 8 is a sectional view showing a state wherein the circuit opposing portion of the bare chip mounting board shown in FIG. 5 is warped to project upward;

DESCRIPTION OF THE PREFERRED EMBODIMENTS

The present invention will be described below in detail with reference to the accompanying drawings.

(First Embodiment)

Figure 1A:
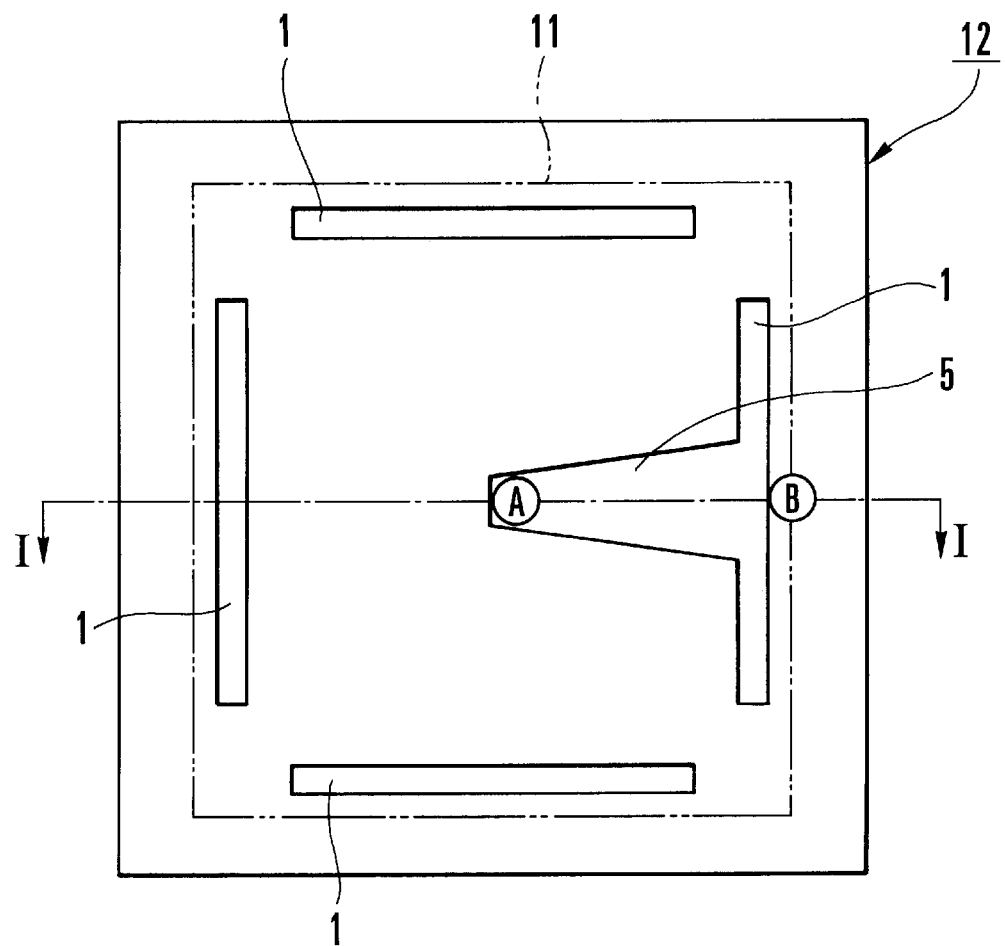
FIGS. 1A and 1B are a plan view of a bare chip mounting board according to the first embodiment of the present invention and a sectional view taken along a line I—I in FIG. 1A, respectively.
Figure 1B:
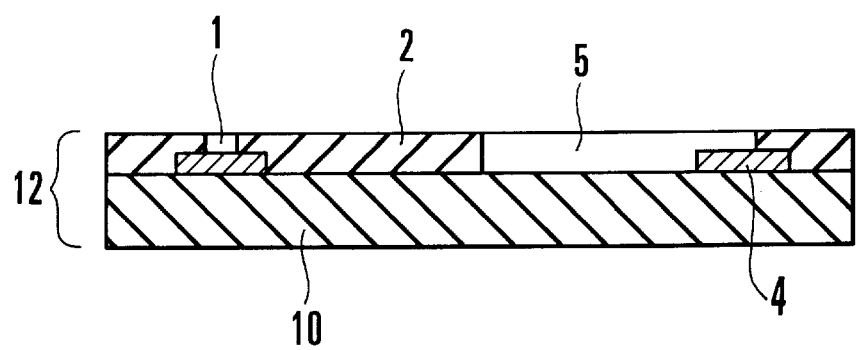

FIG. 1A shows a bare chip mounting board according to the first embodiment of the present invention. FIG. 1B shows a section taken along a line I—I in FIG. 1A. A bare chip mounting portion 11 indicated by an alternate long and two short dashed line in FIG. 2A is a virtual area where a bare chip is mounted. As shown in FIG. 1B, in a bare chip mounting board (to be simply referred to as a board hereinafter) 12, a plurality of board pads 4 to be connected to the bare chip are formed on a wiring board 10 in correspondence with the electrode positions of the bare chip, and a solder resist 2 is formed on the wiring board 10 having the board pads 4.

As shown in FIG. 1A, to connect each board pad 4 to a corresponding electrode of the bare chip, the solder resist 2 has four rectangular opening portions 1 extending parallel to the four sides of the bare chip mounting portion 1 in correspondence with the electrode positions of the bare chip. The solder resist 2 also has a second opening portion 5, i.e., a groove extending from the center of the bare chip mounting portion 11 to one side of the bare chip mounting portion 11 while gradually increasing its width. The second opening portion 5 is coupled to one of the first opening portions 1.

Figure 2:
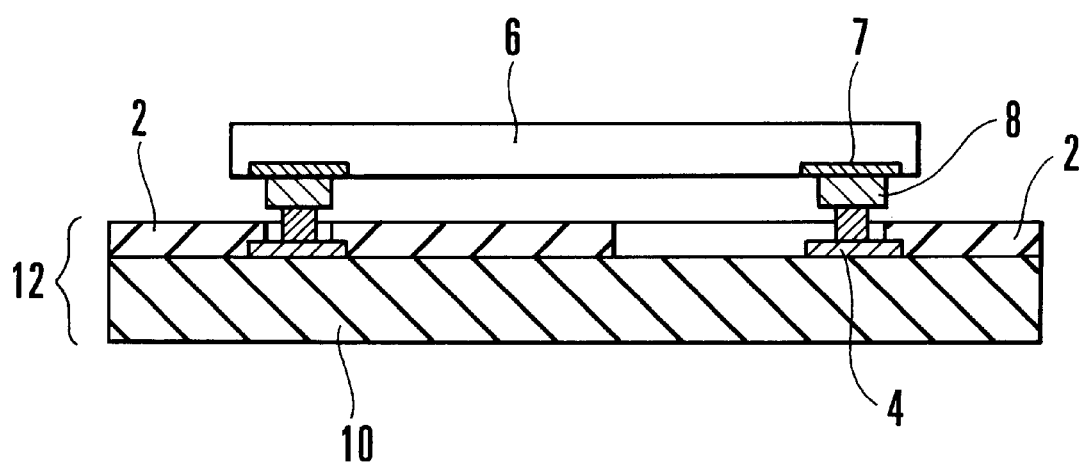
FIG. 2 is a sectional view showing a state wherein a bare chip is mounted on the bare chip mounting board shown in FIGS. 1A and 1B.

FIG. 2 shows a state wherein a bare chip 6 is mounted on the board 12 shown in FIGS. 1A and 1B. As shown in FIG. 2, the bare chip 6 having bumps 8 is placed on the board 12 while directing its upper surface downward. After the bumps 8 and the board pads 4 are positioned, the bumps 8 are heated and fused. When the temperature is reduced to harden the bumps 8, the bare chip 6 is bonded to the board 12.

Various methods can be used to mount the bare chip 6 having bumps on the board 12. For example, a solder is supplied onto the board pads 4 of the board 12 in advance. After the bare chip having bumps is placed on the board 12 and positioned, the structure is heated to solder the bare chip to the board. After the bare chip 6 is mounted on the board 12, a resin is injected into the gap between the board 12 and the bare chip 6. The resin is injected by applying an appropriate amount of resin to the gaps at the four corners or three sides of the bare chip 6 using a dispenser or the like.

Figure 3A:
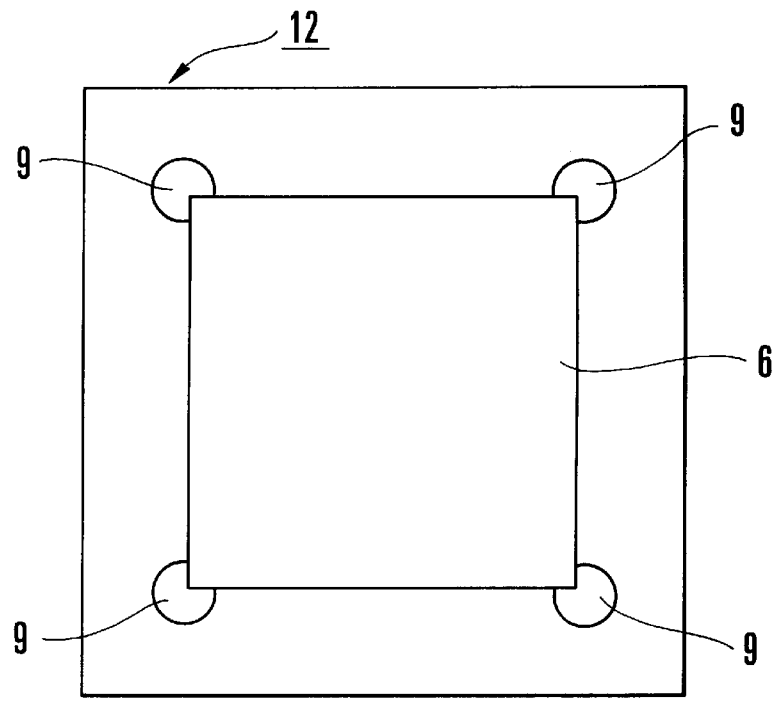
FIGS. 3A and 3B are plan views showing states wherein a resin is applied to the bare chip mounting board shown in FIG. 2, on which the bare chip is mounted, using different methods.
Figure 3B:
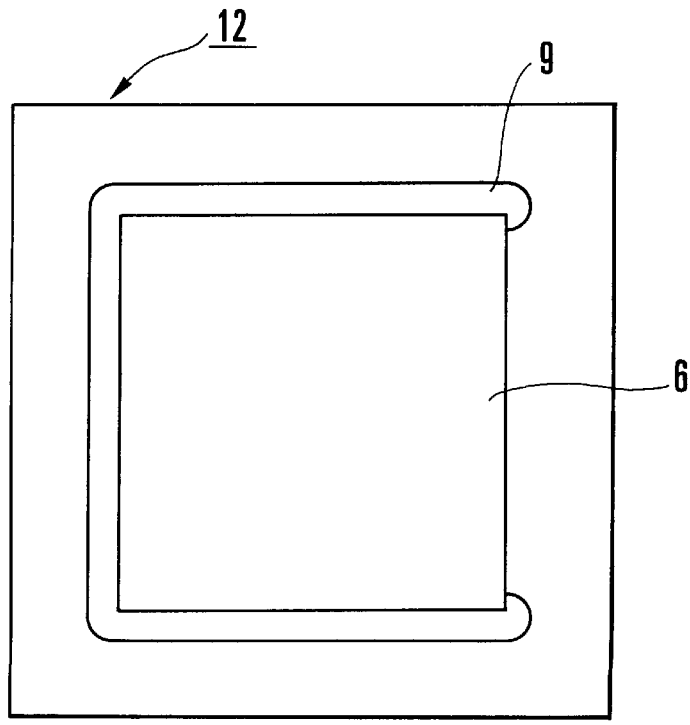

FIGS. 3A and 3B show states wherein a resin is applied to the board 12 on which the bare chip is mounted, using different methods. In the application method shown in FIG. 3A, a resin 9 is spotted to the four corners of the bare chip 6. In the application method shown in FIG. 3B, the bare chip 6 is continuously applied along the three sides of the bare chip 6. In FIG. 3B, the resin 9 is not applied to one side of the bare chip 6 corresponding to the first opening portion 1 coupled to the second opening portion 5 shown in FIG. 1A.

To prevent thermal expansion, a resin having a small thermal expansion coefficient is used in general. A resin having a small thermal expansion coefficient contains a large quantity of filler such as alumina or silica and is difficult to inject because of its high viscosity. To spread a resin having a high viscosity, the board 12 on which the bare chip 6 is mounted is placed on a heating stage and heated. This increases the temperature of the applied resin, so the resin can be injected at a low viscosity.

The resin 9 applied using one of the methods shown in FIGS. 3A and 3B spreads from the application position toward the center of the bare chip 6 due to capillarity. As the resin 9 spreads, air compressed by the spreading resin 9 is removed from the gap through the second opening portion 5 of the board 12.

Until the resin 9 has completely spread to all gaps other than the gap corresponding to the second opening portion 5, the resin 9 never flow into the second opening portion 5 because of the surface tension acting on the resin 9. In addition, the resin 9 does not spread to the gap between the solder resist 2 and the bare chip 6 at one end portion of the bare chip mounting portion 11 where the second opening portion 5 extends, i.e., a portion B shown in FIG. 1A because the gap width is small.

When the resin 9 has completely spread to all gaps except the gap of the second opening portion 5 and the end portion (portion B) of the bare chip mounting portion 11 where the second opening portion 5 extends, the resin 9 gradually flows into the second opening portion 5 from the central portion of the bare chip mounting portion 11, i.e., a portion A shown in FIG. 1A. As the resin 9 flows into the second opening portion 5, air is removed from the second opening portion 5 through the end portion of the bare chip mounting portion 11 where the second opening portion 5 extends.

At this time, since the resin 9 flows from the central portion (portion A) of the bare chip mounting portion 11 into the second opening portion 5, air in the gap of the second opening portion 5 is completely pushed outside. Finally, the gap between the board 12 and the bare chip 6 is wholly filled with the resin 9. Air in the gap is completely removed therefrom, so no voids are formed.

Figure 4:
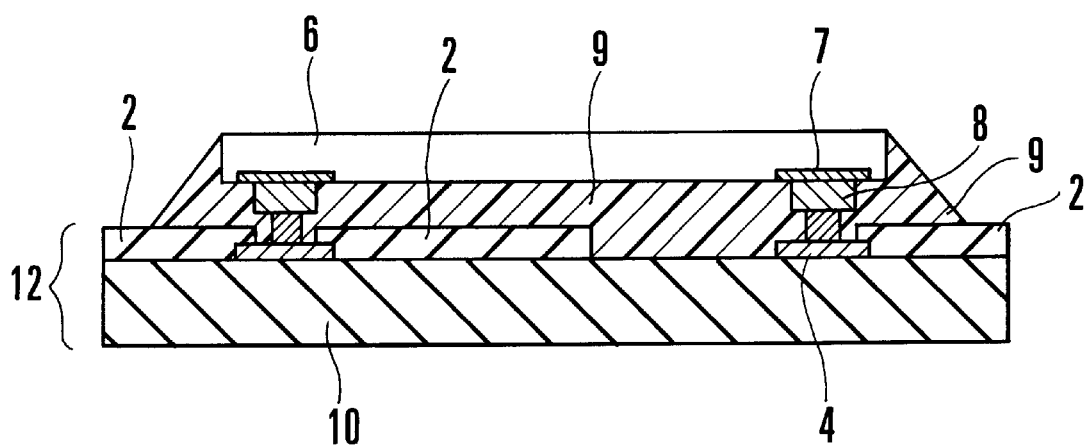
FIG. 4 is a sectional view showing a state wherein the resin is injected into the bare chip mounting board shown in FIG. 2, on which the bare chip is mounted.

FIG. 4 shows a state wherein the gap between the board 12 and the bare chip 6 is filled with the resin 9 in this manner. After the gap is filled with the resin 9, as shown in FIG. 4, the resin 9 is cured to integrate the bare chip 6 with the board 12.

The resin is applied to the four corners or three sides of the bare chip 6 mounted on the board 12 and injected. If the resin 9 can be spread without forming voids, the resin 9 may be applied to any portions except the peripheral portion (near the portion B shown in FIG. 1A) of the bare chip corresponding to the end portion of the second opening portion 5 serving as a passage for air to be removed.

As described above, according to the first embodiment, a groove, i.e., the second opening portion 5 extending from the center of the bare chip mounting portion 11 to one side of the bare chip mounting portion 11 while gradually increasing its width is formed in the solder resist 2 formed on the board 12, thereby completely removing air in the gap between the board 12 and the bare chip in resin injection. With this method, the bare chip 6 can be reliably bonded to the board 12 without forming any voids. Since no voids are formed, no through hole need be formed in the bare chip mounting portion 11 to prevent voids, unlike the prior art. The wiring arrangement of the bare chip mounting portion 11 is not restricted. In addition, a decrease in wiring space can be prevented, so the wiring efficiency does not lower.

In the first embodiment, the resin 9 is applied to not two corners or two sides of the bare chip 6 but four corners or three sides of the bare chip 6, so the resin can be injected in a short time.

In the first embodiment, the board 12 has the solder resist 2. When a bare chip is to be mounted on a board having no solder resist, the same effect as described above can be obtained by forming a groove having a shape similar to the second opening portion 5 in the board itself, on which the bare chip is to be mounted.

(Second Embodiment)

Figure 5:
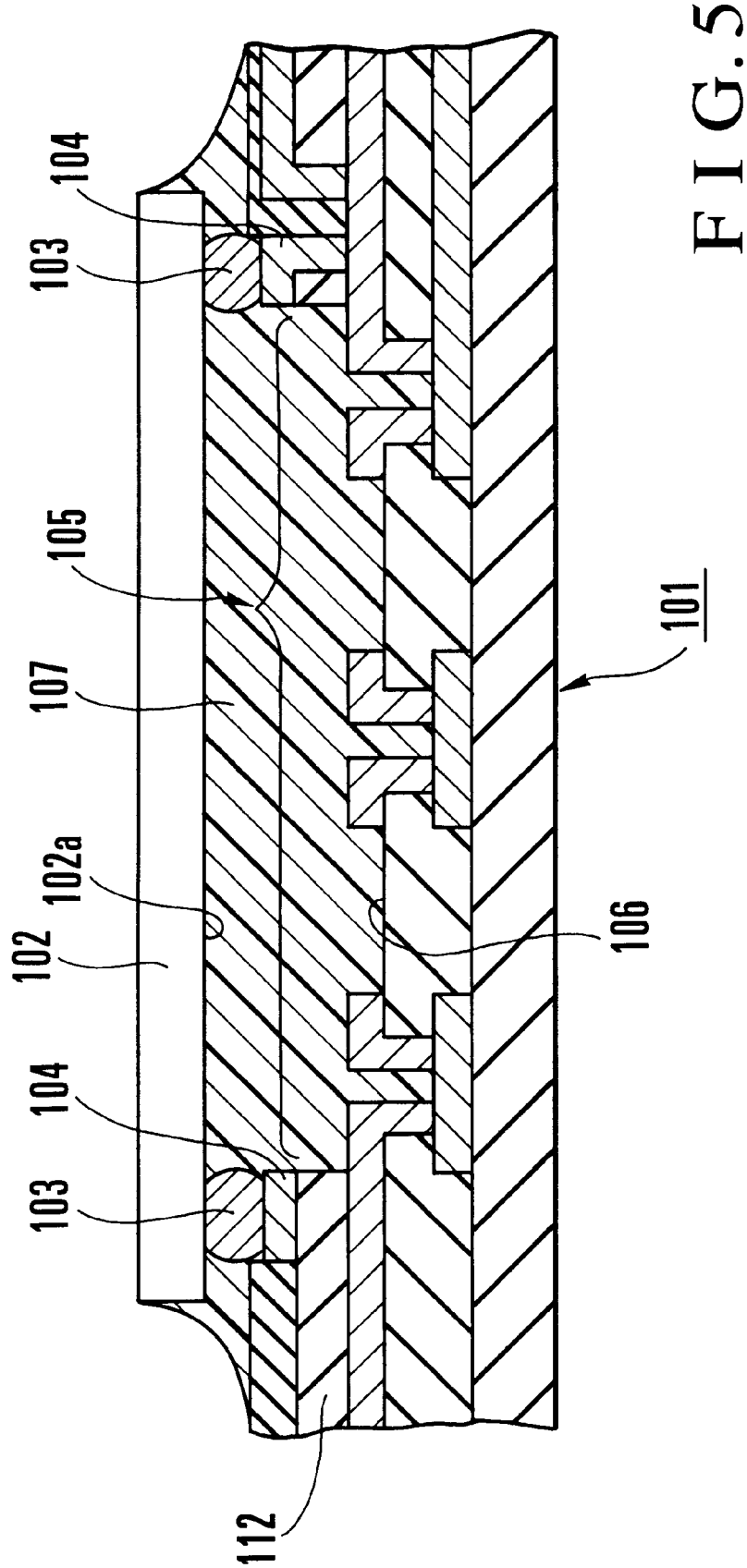
FIG. 5 is a sectional view of a bare chip mounting board according to the second embodiment of the present invention.

FIG. 5 shows a bare chip mounting board according to the second embodiment of the present invention. FIG. 6 shows the bare chip mounting board shown in FIG. 5.

Referring to FIG. 5, a bare chip mounting board (to be simply referred to as a board hereinafter) 101 has a core material consisting of a glass-epoxy resin and is formed by build-up (to be described later). A chip mounting portion 108 (FIG. 6) on the board 101 having a three-layer build-up structure has connection pads 104 to be connected to a wireless semiconductor chip (to be simply referred to as a semiconductor chip hereinafter) 102. When the semiconductor chip 102 is mounted on the board 101, the semiconductor chip 102 is connected to the connection pads 104 on the board 101 through solder bumps 103 formed on a circuit device surface 102a to a height of 30 to 50 µm. The solder bumps 103 are formed along the four sides of the semiconductor chip 102. The connection pads 104 are formed on the board 101 in correspondence with the solder bumps 103.

Recessed portions 106 are formed in a circuit opposing portion 105 which opposes the circuit device surface 102 of the semiconductor chip 102 mounted on the board 101 and constitutes the chip mounting portion 108 of the board 101. As shown in FIG. 6, the recessed portions 106 are formed in a rectangular area surrounded by the connection pads 104 corresponding to the solder bumps 103. The recessed portions 106 are lower than the outer surface of the connection pads 104 by 60 to 70 µm. The gap between the board 101 and the semiconductor chip 102 is filled with a sealing resin 107 consisting of an epoxy resin. The sealing resin 107 is also applied along the edge of the semiconductor chip 102 to hermetically seal the circuit device surface 102a of the semiconductor chip 102. Reference numeral 112 denotes a solder resist.

A method of manufacturing a board 101 having a three-layer build-up structure with the recessed portions 106 in its surface will be described next. A conventional three-layer build-up structure is applied to the board 101, so the conventional method of manufacturing a three-layer build-up structure board will be described first. The method of manufacturing the board 101 used in this embodiment will be described next in comparison with the conventional method.

FIGS. 23A to 23F show steps in manufacturing the conventional three-layer build-up structure board. The conventional method of manufacturing a three-layer build-up structure board is also described in, e.g., "High-density Printed Board Wiring Technique for Portable Device of Next Generation", (NIKKEI ELECTRONICS, No. 633, pp. 99–116, Apr. 1995).

First step: As shown in FIG. 23, a core substrate 109 consisting of, e.g., a glass-epoxy resin is sequentially subjected to electroless copper plating and copper electroplating to form a first conductive layer 110a having a desired wiring pattern and a thickness of approximately 10 to 20 µm.

Figure 23A:
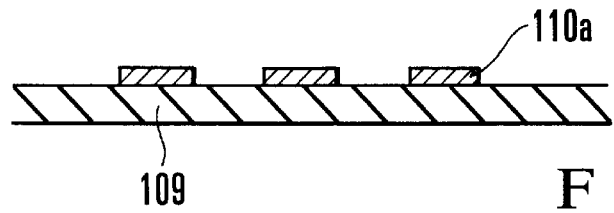
FIGS. 23A to 23F are sectional views showing a state wherein the circuit opposing portion of the bare chip mounting board shown in FIG. 22 is warped to project upward.
Figure 23B:
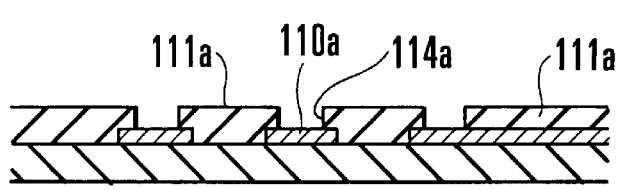

Second step: As shown in FIG. 23B, a photosensitive epoxy resin is applied to the core substrate 109 including the first conductive layer 110a to form a first insulating layer 111a having a thickness of about 50 µm. Via holes 114a each having a diameter of about 100 to 150 µm are selectively formed in the first insulating layer 111a by photolithography. The underlaying first conductive layer 110a is exposed to the bottom portion of each via hole 114a. The upper surface of the first insulating layer 111a may be subjected to satinizing to form a 5 to 10-µm three-dimensional pattern. With this step, a copper foil is caught into the first insulating layer 111a in the subsequent copper plating step, so the peel strength between the first insulating layer 11a and a second conductive layer 110b (to be described later) can be increased.

Figure 23C:
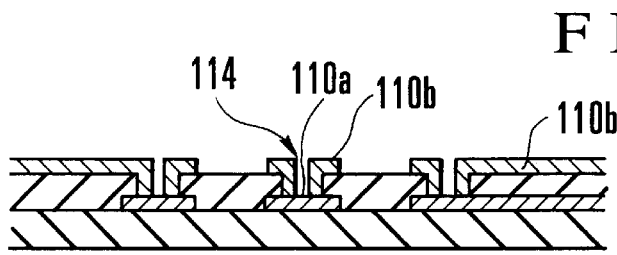

Third step: As shown in FIG. 23C, the first insulating layer 111a including the via holes 114a is sequentially subjected to electroless copper plating and copper electroplating to form the second conductive layer 110b having a thickness of nearly 20 µm. At this time, the inner wall of each via hole 114a is also plated and connected to the underlaying first conductive layer 110a. Thereafter, the surface of the second conductive layer 110b is etched to form a desired wiring pattern and via holes 114.

Figure 23D:
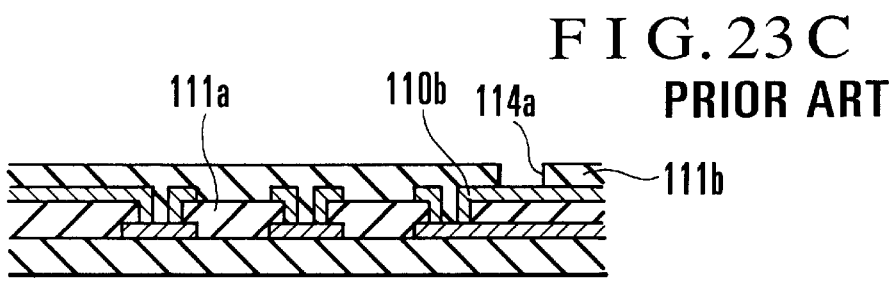

Fourth step: As shown in FIG. 23D, a second insulating layer 111b having via holes 114a is formed on the second conductive layer 110b and the first insulating layer 111a. The second insulating layer 111b having the via holes 114a is formed following the same procedure as in formation of the first insulating layer 111a, and a detailed description thereof will be omitted.

Figure 23E:
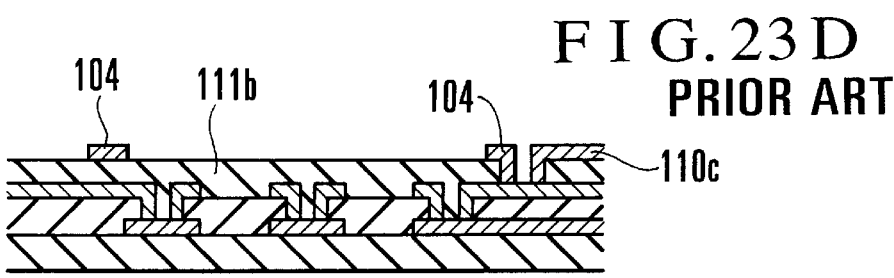

Fifth step: As shown in FIG. 23E, a third conductive layer 110c is formed on the second insulating layer 111b and etched to form a desired wiring pattern and the connection pads 104. The third conductive layer 110c having the wiring pattern and the connection pads 104 is formed following the same procedure as in formation of the second conductive layer 110b, and a detailed description thereof will be omitted.

Figure 23F:
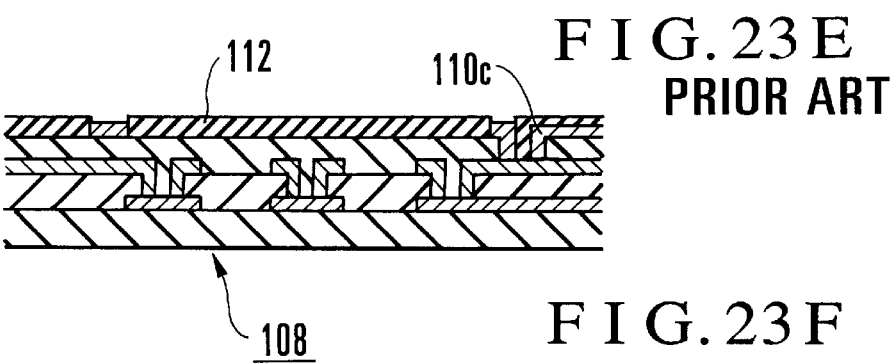

Sixth step: As shown in FIG. 23F, the solder resist 112 is applied to the third conductive layer 110c, thereby completing the conventional three-layer build-up structure board 108. The solder resist 112 is not applied to the surfaces of the connection pads 104. The solder resist 112 is a cover member for preventing a solder from being erroneously applied to an unnecessary portion on the printed board in soldering. As the solder resist 112, an organic resin such as a melanin resin or an epoxy resin is generally used.

The method of manufacturing the board 101 shown in FIGS. 5 and 6 will be described next with reference to FIGS. 7A to 7C. The board 101 is manufactured following the same procedure as in formation of the conventional three-layer build-up structure board 108 although steps after the third step shown in FIG. 23C are partially changed to form the recessed portions 106 on the surface of the board 101.

Figure 7A:
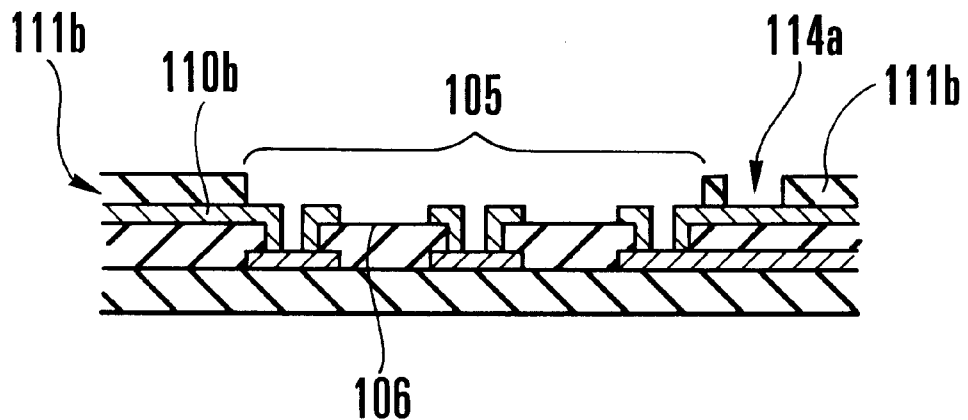
FIGS. 7A to 7C are sectional views for explaining some steps in manufacturing the bare chip mounting board shown in FIG. 5.

As shown in FIG. 7A, after the third step, a photosensitive epoxy resin is applied to the second conductive layer 110b to selectively form the second insulating layer 111b having a thickness of about 50 µm. At this time, not only a portion where the via hole 114 is to be formed but also the circuit opposing portion 105 is also exposed, unlike the prior art. Thereafter, development and etching are performed using a chemical solution to form the recessed portions 106 as well as the via holes 114a in the second insulating layer 111b.

Figure 7B:
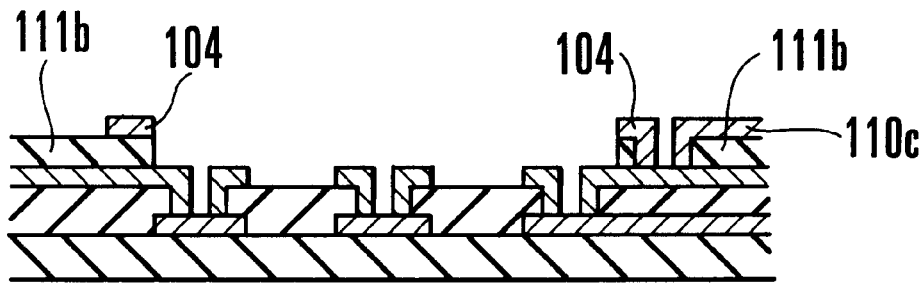

As shown in FIG. 7B, the second insulating layer 111b is sequentially subjected to electroless copper plating and copper electroplating to form the third conductive layer 110c having a thickness of approximately 20 µm. The third conductive layer 110c is etched to form a desired wiring pattern and the connection pads 104.

Figure 7C:
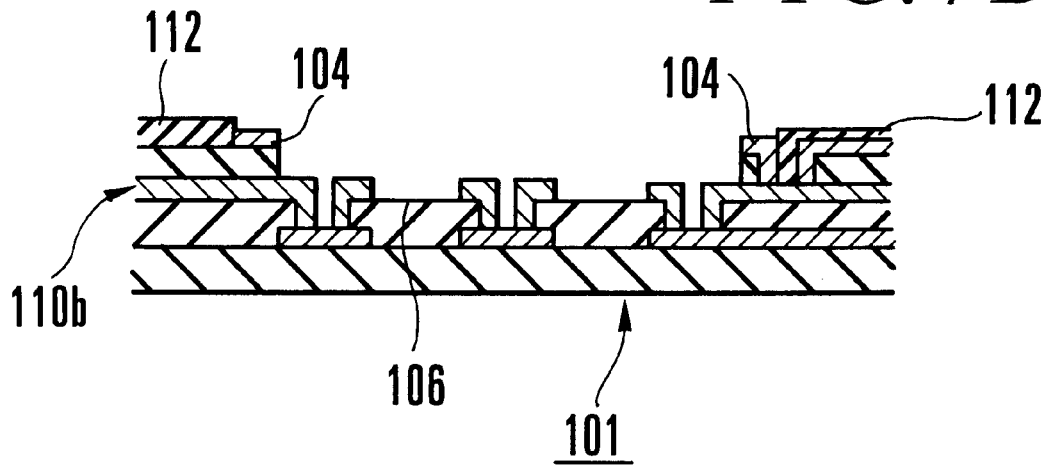

Finally, as shown in FIG. 7C, the solder resist 112 is applied to the surface of the second insulating layer 111b excluding the connection pads 104, thereby completing the board 101. At this time, the second conductive layer 110b is exposed to the bottom portion of each recessed portion 106.

However, the second conductive layer 110b is not exposed to the outer atmosphere after mounting because the recessed portions 106 are filled with the sealing resin 107 in mounting the semiconductor chip 102.

As described above, when the recessed portions 106 are formed in the board 101, the board 101 can be easily manufactured without damaging the connection pads 104 and the third conductive layer 110c in formation of the recessed portions 106.

As shown in FIG. 5, the recessed portion 106 formed in the circuit opposing portion 105 of the board 101 is lower than the surface of the connection pad 104 by about 60 to 70 μm (thickness of the connection pad 104: 10 to 20 μm+depth of the recessed portion 106: 50 μm). For this reason, even when the circuit opposing portion 105 of the board 101 is warped to project upward, the circuit device surface 102a of the semiconductor chip 102 never contact the surface of the board 101 in mounting the semiconductor chip 102 on the board 101.

The channel (i.e., gap) for flowing the sealing resin 107 becomes wide under the semiconductor chip 102, so the frictional resistance in injecting the sealing resin 107 decreases as compared to the prior art in which the channel is uniform and narrow. For this reason, the sealing resin 107 can be injected into the gap between the board 101 and the semiconductor chip 102 in a shorter time. Bubbles are hardly be left in the sealing resin 107, so voids can be prevented.

In addition, the thickness of the sealing resin 107 injected into the gap between the board 101 and the circuit device surface 102a of the semiconductor chip 102 increases by the depth of the recessed portion 106, as compared to the prior art, so water from the board 101 can hardly reach the circuit device surface 102a. This is because the sealing resin 107 has a higher humidity resistance than that of the material of the board 101, i.e., a glass-epoxy resin, and water is more unlikely to permeate in proportion to the thickness of the resin. When a stress due to the difference in thermal expansion coefficient between the semiconductor chip 102 and the board 101 is applied to the semiconductor chip 102, the stress is dispersed over the lower surface of the semiconductor chip 102, so the stress per solder bump 103 can be relaxed. This effect becomes large in proportion to the thickness of the sealing resin 107, and the connection strength between the semiconductor chip 102 and the board 101 increases.

As described above, in the second embodiment, the circuit opposing portion 105 of the board 101 has the recessed portions 106. For this reason, even when the circuit opposing portion 105 is warped to project upward, the semiconductor chip 102 can be quickly and easily mounted on the board 101 without destroying the semiconductor chip 102. In addition, the humidity resistance and reliability of connection strength after mounting can be improved.

Figure 9:
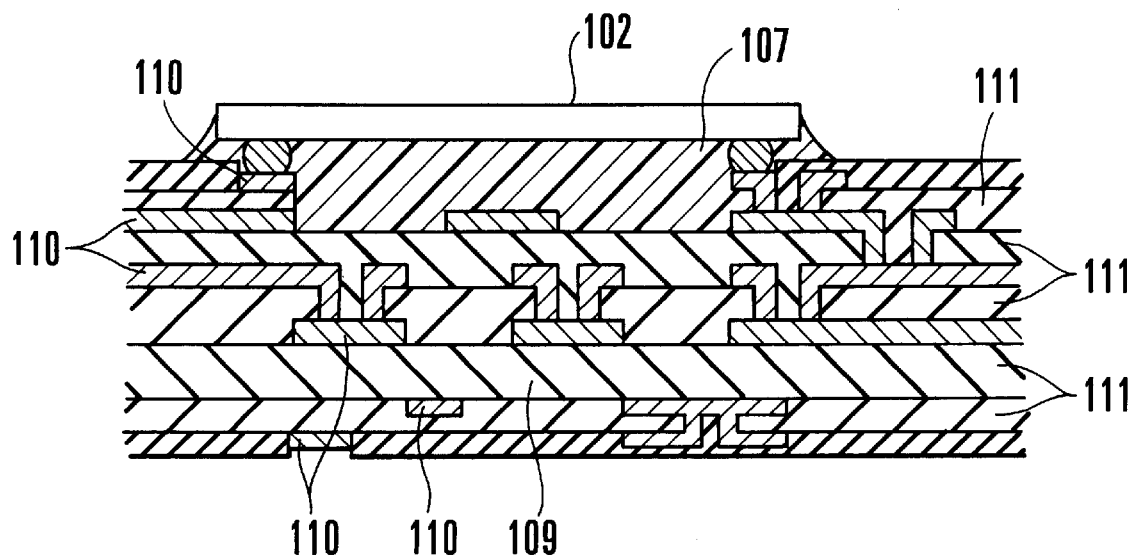
FIG. 9 is a sectional view of a modification of the bare chip mounting board shown in FIG. 5.
Figure 10:
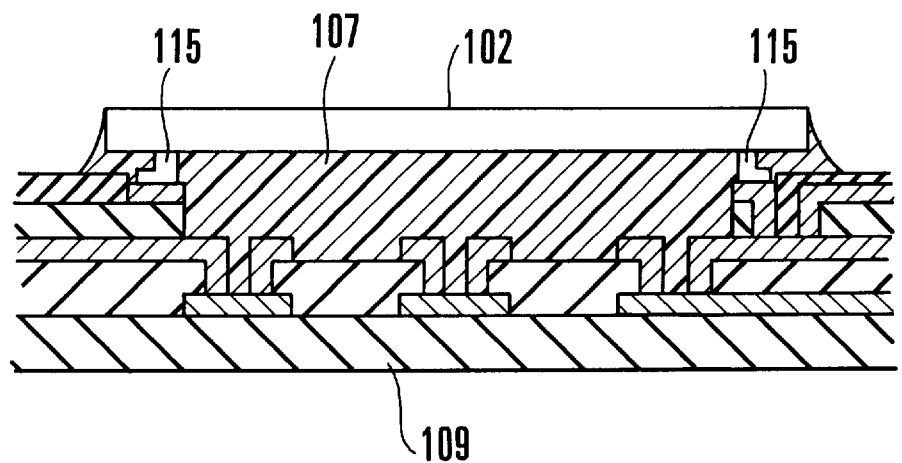
FIG. 10 is a sectional view of another modification of the bare chip mounting board shown in FIG. 5.
Figure 11:
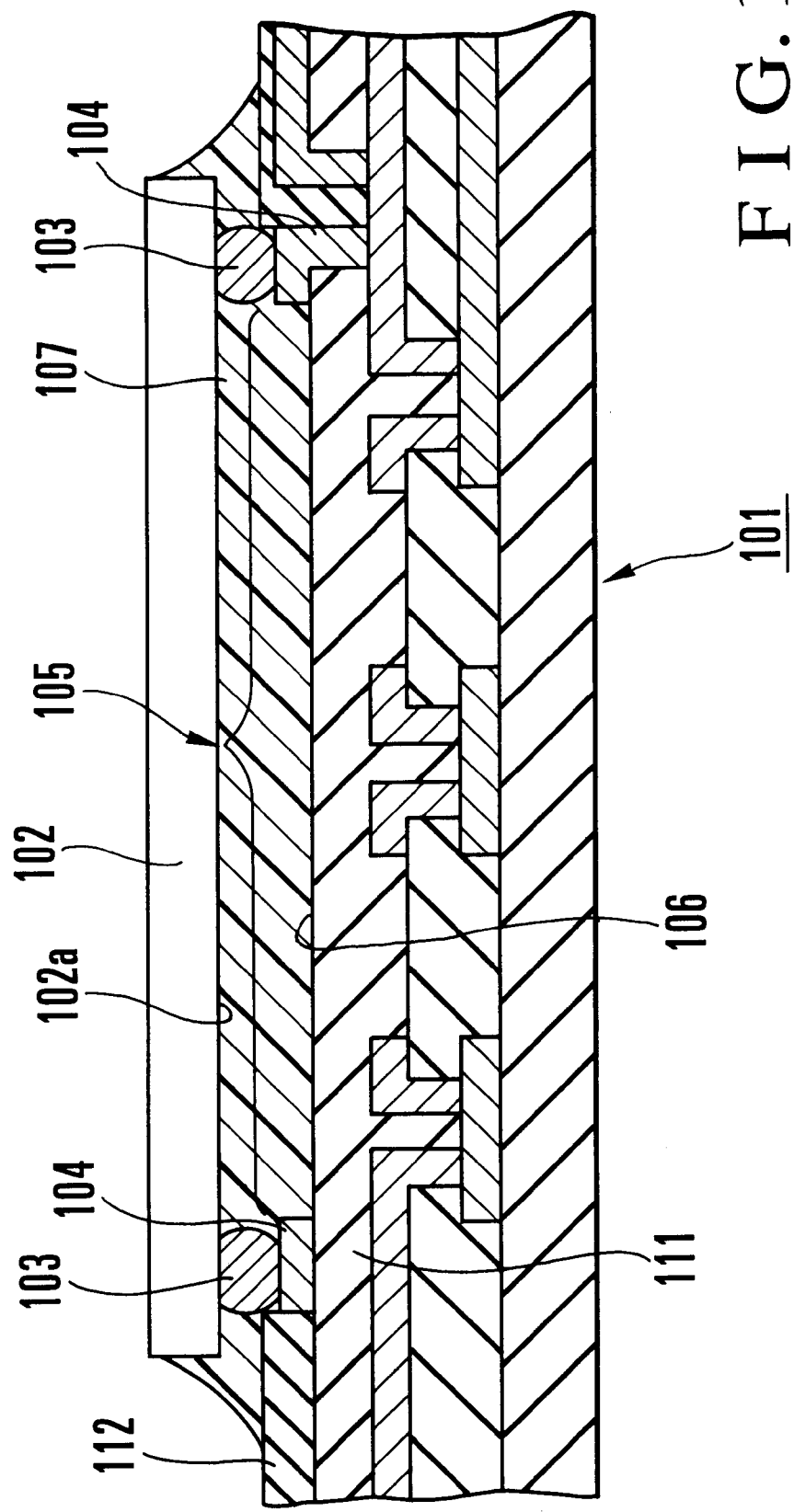
FIG. 11 is a sectional view of still another modification of the bare chip mounting board shown in FIG. 5.

FIGS. 9 to 11 show a modification of the board 101 shown in FIG. 5.

As shown in FIG. 9, the present invention is not limited to the three-layer build-up board. The number of conductive layers 110 and insulating layers 111 may be increased to four or more. The conductive layers 110 and insulating layers 111 may be stacked not only on the upper surface of the core substrate 109 but also on the lower surface.

For the core substrate 109 of the board 101, an insulating material such as a ceramic-based alumina or a glass ceramic may be used in place of the glass-epoxy resin. When a flexible material is used, a flexible build-up board can be formed.

As shown in FIG. 10, even when a beam lead chip thermally bonded using beam leads 115 of gold or platinum is used instead of the flip chip connected through the solder bumps 103, the same effect as described above can be obtained.

As shown in FIG. 11, the recessed portions 106 may be formed in the board 101 without applying the solder resist 112 to the surfaces of the circuit opposing portion 105 and the connection pads 104 of the board 101. In this case as well, the recessed portion 106 has a depth of nearly 10 to 20 μm corresponding to the thickness of the connection pad 104. When the height of the solder bump 103 or beam lead 115 is added, the gap between the bottom surface of the semiconductor chip 102 and the recessed portions 106 becomes 40 to 70 μm. For this reason, the semiconductor chip 102 can be prevented from being destroyed in mounting the semiconductor chip 102, the sealing resin 107 can be quickly and easily injected, and the reliability after mounting can be improved. In addition, the recessed portions 106 can be formed only by partially preventing the surface of the board 101 from being coated with the solder resist 112, formation of the recessed portions 106 can be simplified, so the board 101 can be easily manufactured.

In the second embodiment, the build-up board is used. However, the board 101 is not limited to the build-up board. As far as the circuit opposing portion 105 has the recessed portions 106, the same effect as described above can be obtained even in use of a conventional printed circuit board or flexible board.

In the second embodiment, the recessed portions 106 are formed in the step of forming the board 101. However, after a conventional board having no recessed portions 106 is formed, the recessed portions 106 may be formed in the circuit opposing portion 105 of the board 101 by cutting the circuit opposing portion 105 of the board 101 using a milling cutter or laser cutter. According to this method, even in use of a conventional printed wiring board instead of the build-up board for which the recessed portions 106 are formed during formation of the board, the recessed portions 106 can be formed in the circuit opposing portion 105.

(Third Embodiment)

Figure 12:
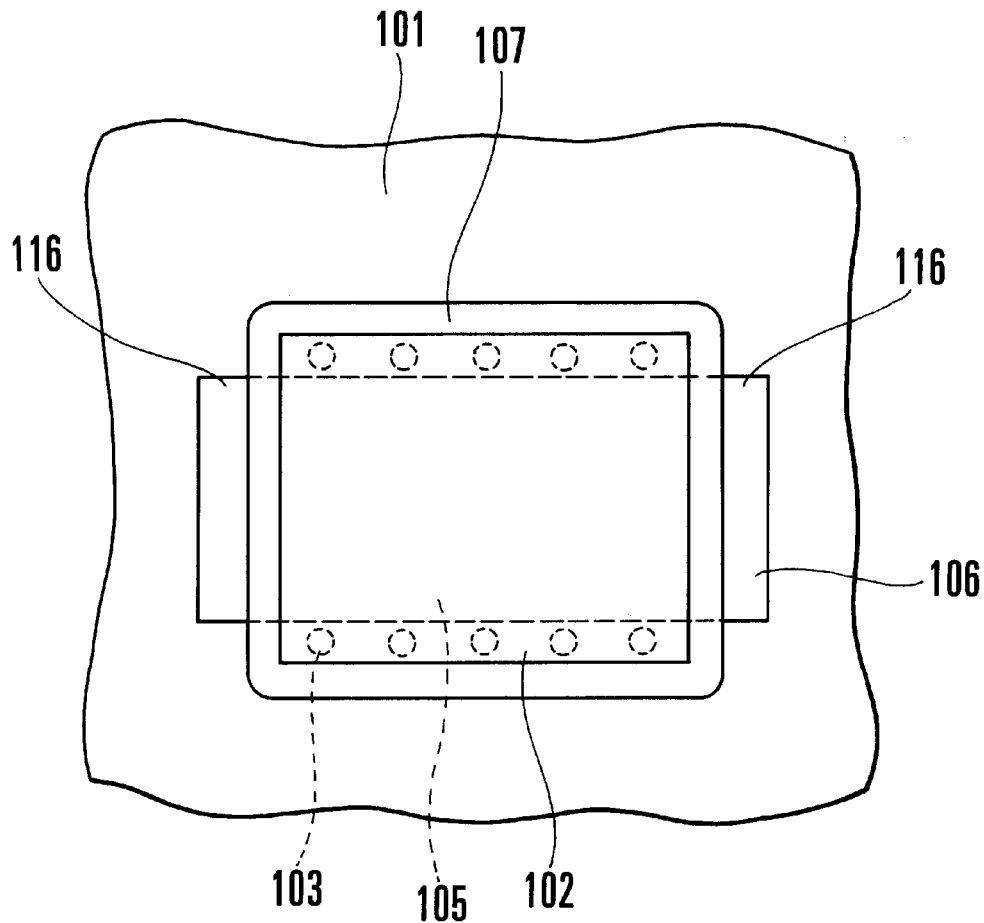
FIG. 12 is a plan view of a bare chip mounting board according to the third embodiment of the present invention.
Figure 13:
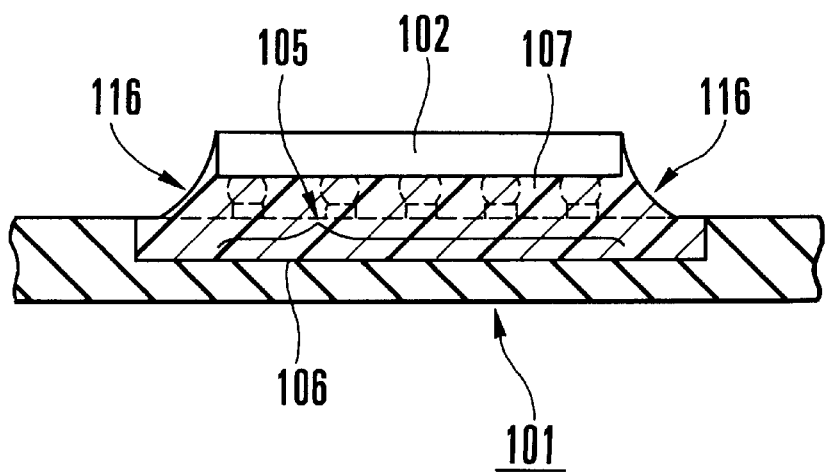
FIG. 13 is a sectional view of the bare chip mounting board shown in FIG. 12.

FIG. 12 shows a bare chip mounting board according to the third embodiment of the present invention. FIG. 13 shows a section of the bare chip mounting board shown in FIG. 12. The same reference numerals as in the second embodiment shown in FIGS. 5 and 6 denote the same parts in FIGS. 12 and 13, and a detailed description thereof will be omitted.

Referring to FIGS. 12 and 13, a recessed portion 106 of a board 101 is partially exposed from the edge of a semiconductor chip 102. This exposed portion of the recessed portion 106 forms an inlet 116 for injecting a sealing resin 107 into the gap between the board 101 and the semiconductor chip 102. The recessed portion 106 may have the exposed portion serving as the inlet 116 at a portion on one side of the semiconductor chip 102 or at two portions on both sides.

In the second embodiment, the recessed portion 106 is formed only in a circuit opposing portion 105. In the third embodiment, however, the recessed portion 106 is exposed to a portion under the edge of the semiconductor chip 102. For this reason, the inlet 116 for injecting the sealing resin 107 is large, so the frictional resistance in injecting the sealing resin 107 can be further lowered. When two inlets 116 are formed, as shown in FIGS. 12 and 13, one inlet 116 serves as a vent in injecting the sealing resin 107 from the other inlet 116, so air can be easily removed. For this reason, the sealing resin 107 can be injected into the gap between the board 101 and the semiconductor chip 102 in a short time.

In addition, bubbles are hardly be formed in the sealing resin 107, so voids can be prevented. When the sealing resin 107 is injected simultaneously from the two inlets 116, the injection time of the sealing resin 107 can be made shorter.

As described above, according to the third embodiment, the effect of the second embodiment can be obtained, and additionally, the sealing resin 107 can be more quickly and easily injected into the gap between the board 101 and the semiconductor chip 102.

Figure 14:
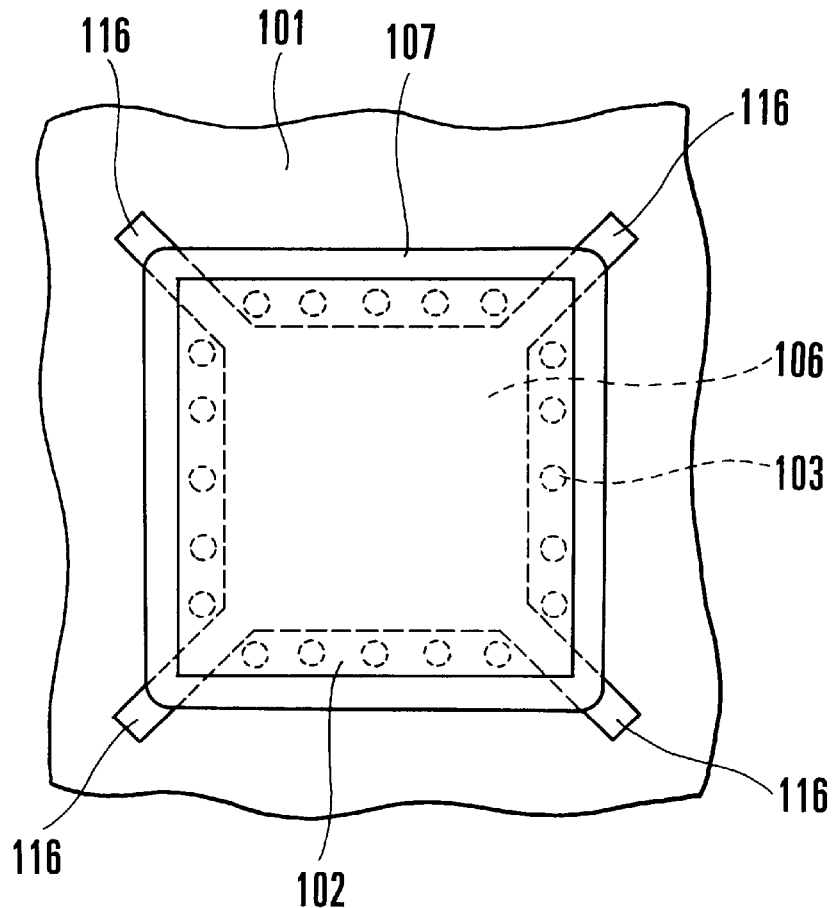
FIG. 14 is a plan view showing a modification of inlets of the bare chip mounting board shown in FIGS. 12 and 13.

FIG. 14 shows a modification of the inlet in the board 101 of the third embodiment.

As shown in FIG. 14, the inlets 116 for injecting the sealing resin 107 may be radially exposed from the four corners of the semiconductor chip 102. This arrangement is effective when solder bumps 103 or beam leads are formed at the four sides of the semiconductor chip 102, and the wide inlets 116 as shown in FIG. 12 cannot be formed. With this arrangement, even when each inlet 116 is narrow, the injection time of the sealing resin 107 can be shortened by forming four inlets 116. When the sealing resin 107 is injected from the four directions, bubble formation in the sealing resin 107 can be prevented, and voids can be more properly prevented.

(Fourth Embodiment)

Figure 15:
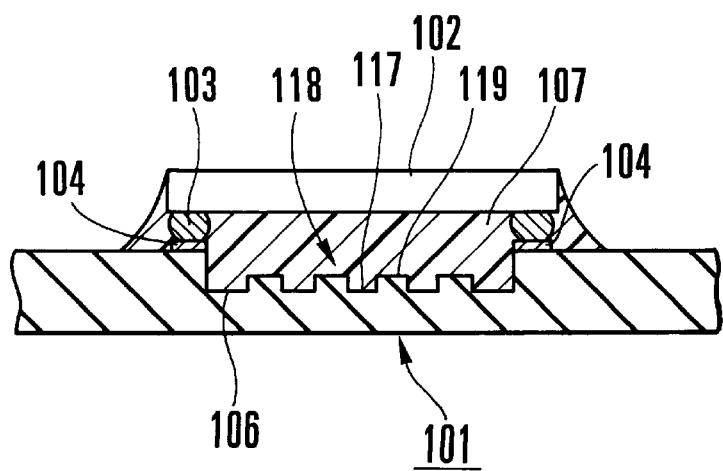
FIG. 15 is a sectional view of a bare chip mounting board according to the fourth embodiment of the present invention.
Figure 16:
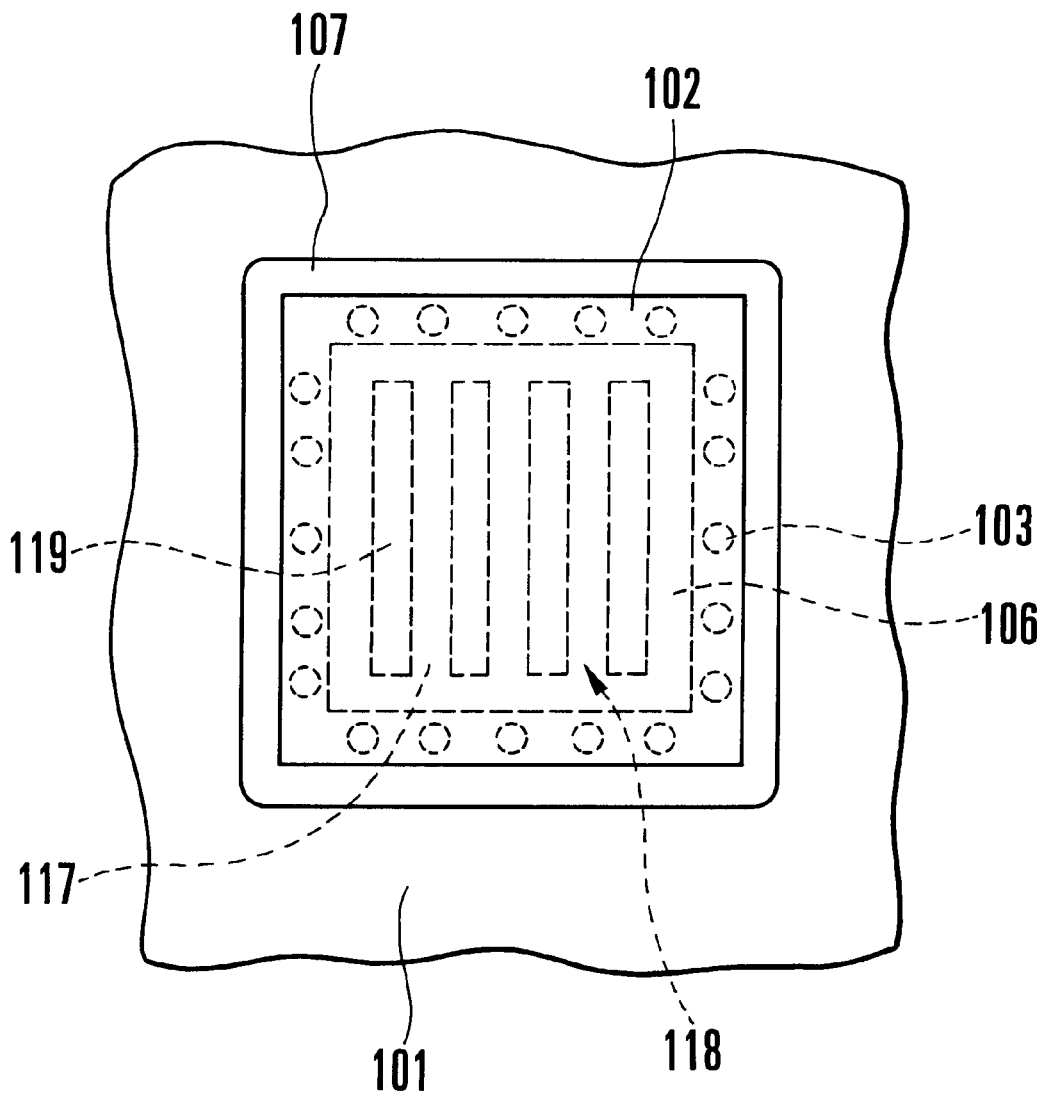
FIG. 16 is a plan view of the bare chip mounting board shown in FIG. 15.

FIG. 15 shows a bare chip mounting board according to the fourth embodiment of the present invention. FIG. 16 shows the bare chip mounting board shown in FIG. 15. The same reference numerals as in the second embodiment shown in FIGS. 5 and 6 denote the same parts in FIGS. 15 and 16, and a detailed description thereof will be omitted.

Referring to FIGS. 15 and 16, a plurality of groove portions 117 are formed in parallel on the bottom portion of a recessed portion 106 of a board 101, thereby forming a parallel three-dimensional pattern 118. The depth from the upper surface of a connection pad 104 to the recessed portion 117 of the parallel three-dimensional pattern 118, i.e., the maximum depth of the recessed portion 106 is approximately 50 $\mu$m. The height of a projecting portion 119 of the parallel three-dimensional pattern 118 from the recessed portion 117 is about 20 $\mu$m. This corresponds to the minimum depth of the recessed portion 106. The depth from the upper surface of the connection pad 104 to the projecting portion 119 is about 30 $\mu$m. This structure increases the contact area between the board 101 and a sealing resin 107 and accordingly the connection strength between the board 101 and a semiconductor chip 102.

In the fourth embodiment, therefore, the effect of the first embodiment can be obtained, and additionally the connection reliability between the board 101 and the semiconductor chip 102 can be further improved.

Figure 17:
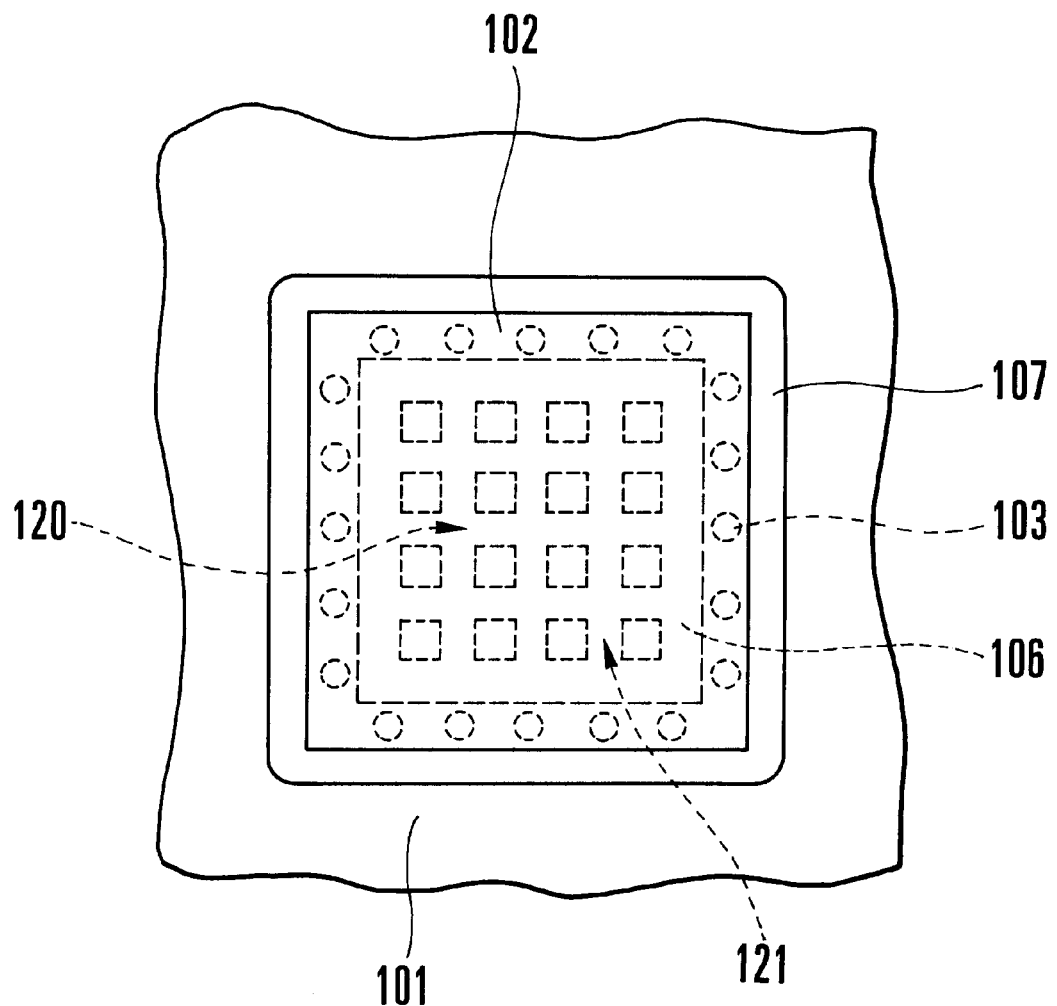
FIG. 17 is a plan view showing an application example of recessed/projecting grooves in the bare chip mounting board shown in FIGS. 15 and 16.
Figure 18A:
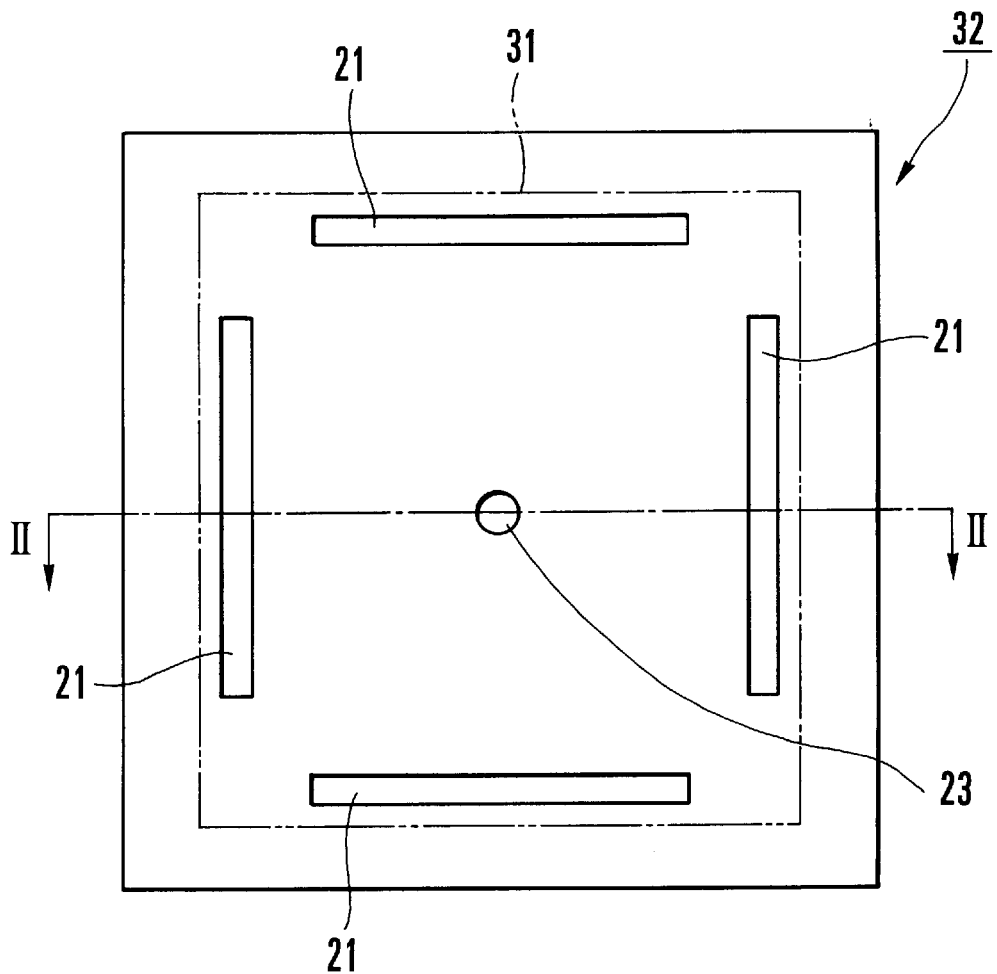
FIGS. 18A and 18B are a plan view of a conventional bare chip mounting board and a sectional view taken along a line II—II in FIG. 18A.
Figure 18B:
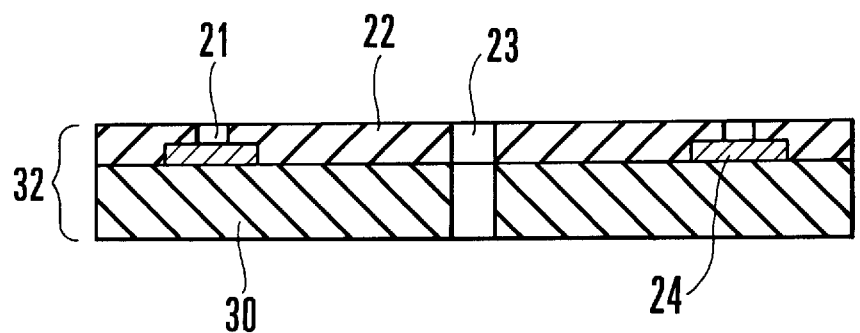
Figure 19:
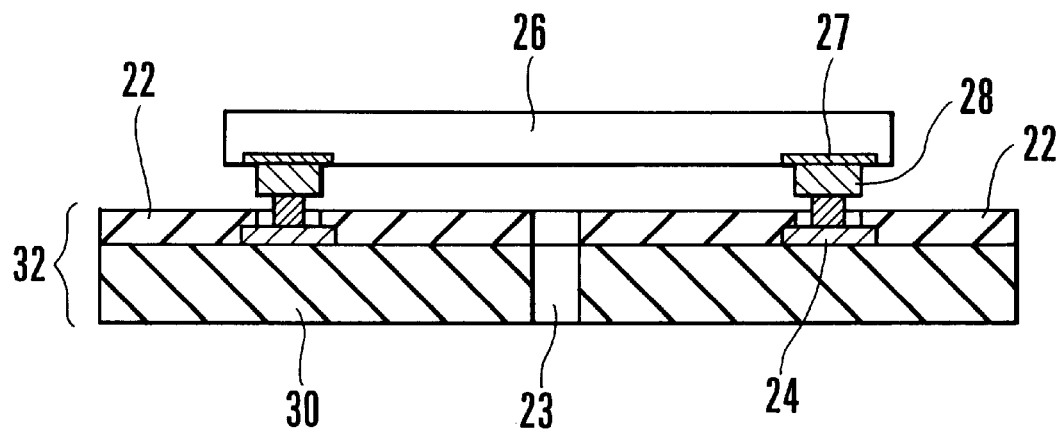
FIG. 19 is a sectional view showing a state wherein a bare chip is mounted on the conventional bare chip mounting board shown in FIGS. 18A and 18B.
Figure 20:
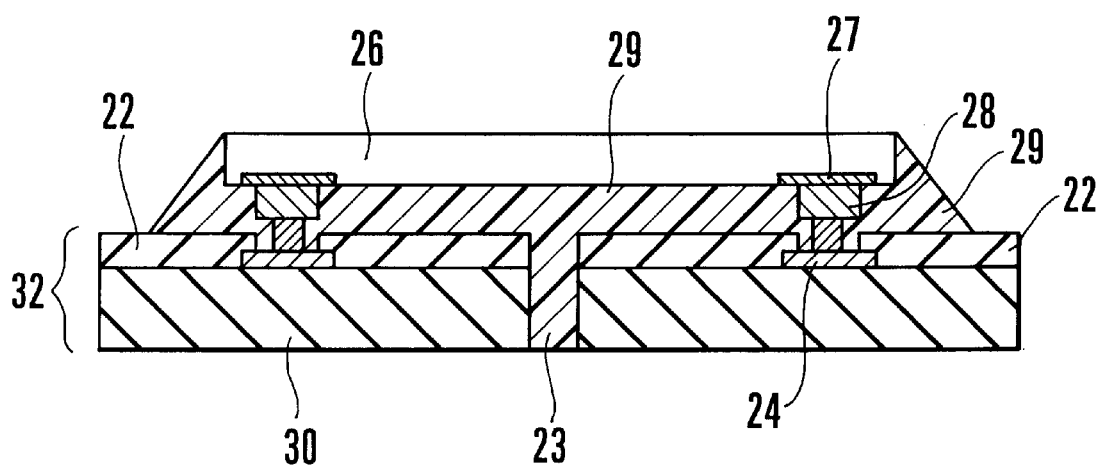
FIG. 20 is a sectional view showing a state wherein a resin is injected into the conventional bare chip mounting board shown in FIG. 19, on which the bare chip is mounted.
Figure 21:
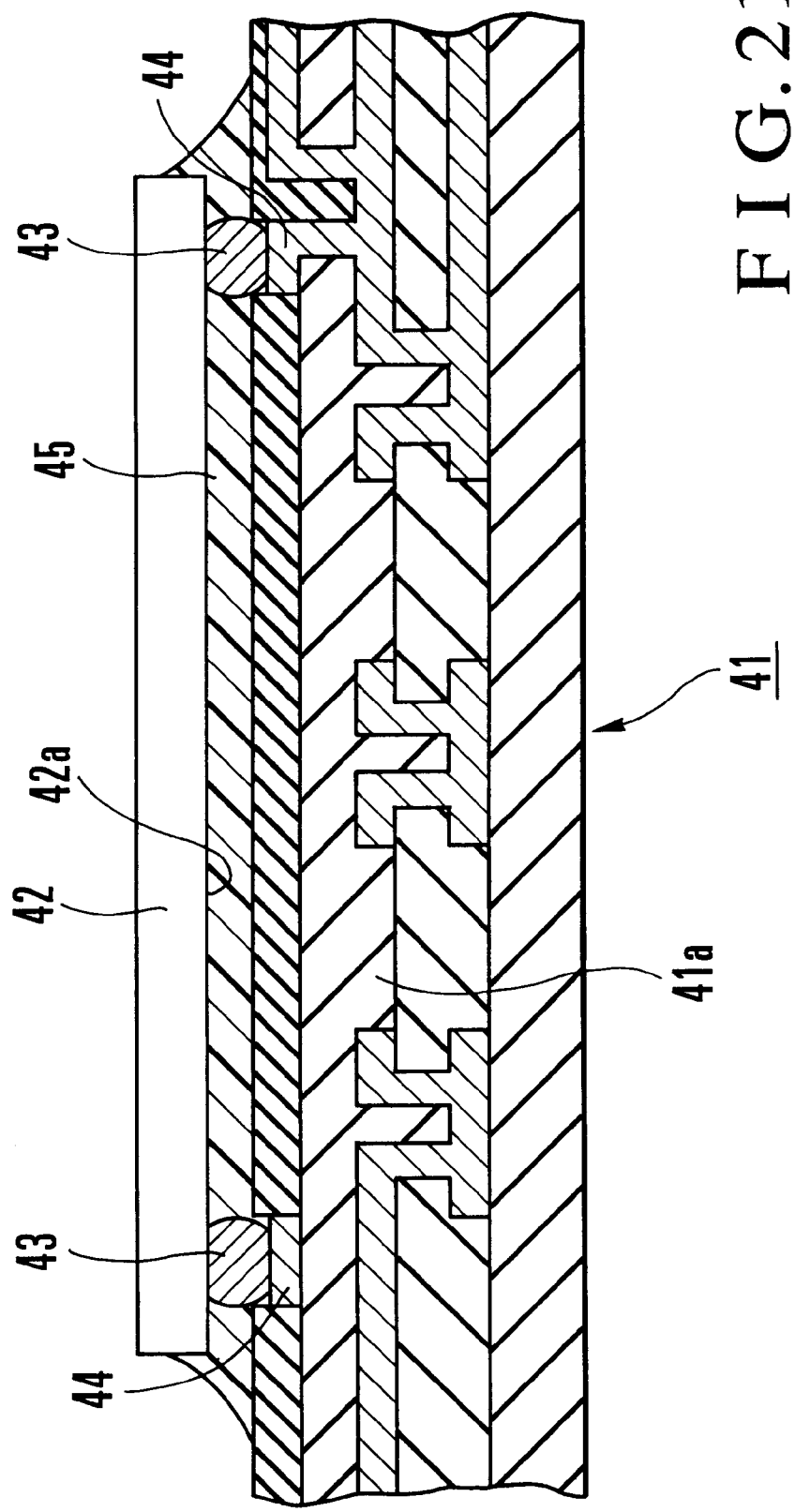
FIG. 21 is a sectional view of another conventional bare chip mounting board.
Figure 22:
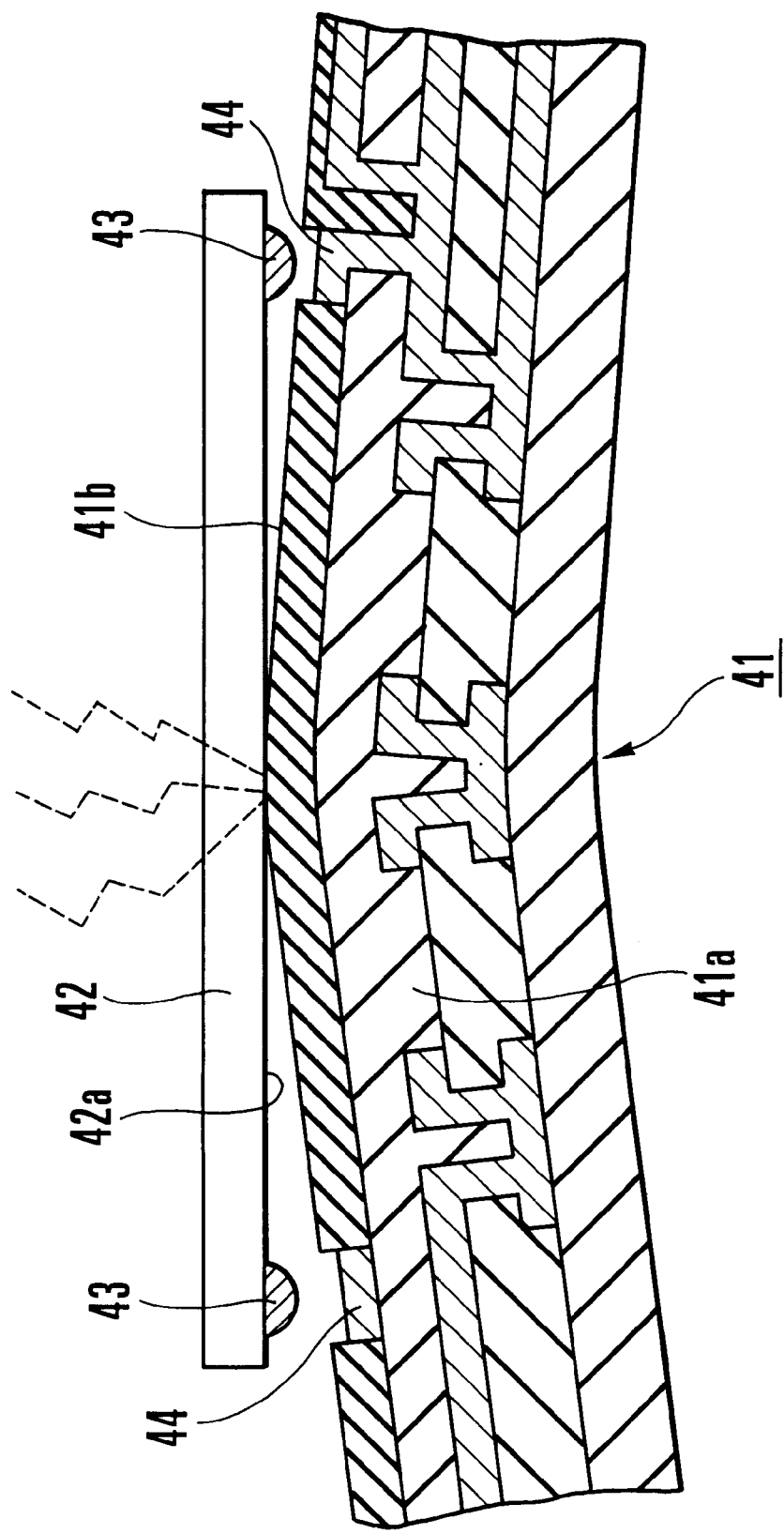
FIG. 22 is a sectional view for explaining a series of steps in manufacturing a conventional three-layer build-up board.

FIG. 17 shows a modification of the three-dimensional pattern on the board 101 of the fourth embodiment.

As shown in FIG. 17, when recessed portions 120 are arranged in a matrix to form a matrix three-dimensional pattern 121.

When the recessed portions 120 are arranged in a matrix, the contact area between the board 101 and the sealing resin 107 can be further increased. Accordingly, the connection reliability between the board 101 and the semiconductor chip 102 can be further improved.

In FIGS. 16 and 17, when the parallel three-dimensional pattern 118 or the matrix three-dimensional pattern 121 is to be formed on the recessed portion 106 of the board 101, inlets 116 for injecting the sealing resin 107 as in the third embodiment are preferably simultaneously formed. More specifically, in the board 101 of the fourth embodiment as well, since the minimum depth of the recessed portion 106 is 30 $\mu$m, bubbles are hardly be formed in the sealing resin 107 in injecting the sealing resin 107 into the gap between the board 101 and the semiconductor chip 102, so voids can be prevented. However, when the inlets 116 are simultaneously formed, the sealing resin 107 can be injected from not the upper side but the lower side of the recessed portion 106 into the gap while removing air. For this reason, the sealing resin 107 can be more properly injected without forming bubbles in the recessed portions 117 or 120.

As described above, when the inlets 116 for injecting the sealing resin 107 are simultaneously formed in formation of the three-dimensional pattern 118 or 121 on the recessed portion 106 of the board 101, bubble formation in the recessed portions 117 or 120 can be more properly prevented.

As has been described above, according to the present invention, a groove extending from the center of the mounting portion toward one side of the mounting portion is formed while gradually increasing its width. When a resin is to be injected into the gap between the bare chip mounting board and the bare chip, the resin is applied to the gaps around the bare chip and spread. Air in the gap or groove is completely removed as the resin spreads. With this arrangement, the resin can be injected without forming voids in the gap between the bare chip mounting board and the bare chip, so the connection reliability between the bare chip mounting board and the bare chip can be made high.

Unlike the prior art, a through hole for injecting the resin without forming voids need not be formed at the bare chip mounting portion of the bare chip mounting board. Therefore, the wiring arrangement of the bare chip mounting board is not limited. In addition, the wiring space will not decrease.

The resin can be applied to not two corners or two sides of the bare chip but four corners or three sides of the bare chip, so the resin can be injected in a short time.

A recessed portion lower than the upper surface of the connection pad is formed on the circuit opposing portion of the bare chip mounting board. For this reason, even when the circuit opposing portion of the board is warped, the semiconductor chip can be quickly and easily mounted on the board without destroying the semiconductor chip. In addition, the humidity resistance and reliability of connection strength after mounting can be improved.

The recessed portion is formed by removing the surface of the circuit opposing portion. Therefore, even when not a build-up board in which the recessed portion is formed during formation of the board but a conventional printed wiring board is used, the recessed portion can be formed in the circuit opposing portion.

In a bare chip mounting board on which a solder resist is applied, a recessed portion lower than the upper surface of the connection pad can be formed without applying the circuit opposing portion, so the recessed portion formation process can be simplified.

When the recessed portion is partially exposed from the edge of the semiconductor chip, an inlet for injecting the sealing resin into the gap between the bare chip mounting board and the semiconductor chip is formed, so the sealing resin can be more quickly and easily injected.

When two or more inlets are formed, the sealing resin can be injected into the gap between the bare chip mounting board and the semiconductor chip in a shorter time. In addition, bubbles are hardly be formed in the sealing resin, so voids can be prevented.

When a three-dimensional pattern is formed on the bottom portion of the recessed portion, the contact area between the bare chip mounting board and the sealing resin increases, and accordingly, the connection strength between the bare chip mounting board and the semiconductor chip increases. Therefore, the connection reliability between the bare chip mounting board and the semiconductor chip can be further improved.

What is claimed is:

1. A chip component mounting board comprising:
   a chip mounting portion on which a chip component is to be mounted, said chip mounting portion having a connection pad electrically connected to said chip component; and
   a first groove formed in said chip mounting portion to extend from a center of said chip mounting portion to one side of said chip mounting portion while gradually increasing a width.

2. A board according to claim 1, further comprising four second grooves extending inside and along four sides of said chip mounting portion having a rectangular shape,
   so that the first groove communicates with one of the second grooves at a wider end portion.

3. A board according to claim 2, further comprising a sealing resin injected into a gap between said mounted chip component and said chip mounting portion,
   so that said sealing resin is applied to four corners or three sides of said chip component.

4. A board according to claim 1, further comprising a solder resist covering a surface of said chip mounting portion,
   so that the first groove is formed by partially removing said solder resist.

5. A chip component mounting board comprising:
   a chip mounting portion on which a chip component is mounted;
   a connection pad formed on said chip mounting portion and electrically connected to said chip component; and
   a recessed portion formed on said chip mounting portion to oppose a circuit device surface of said chip component connected to said connection pad, the recessed portion having a bottom surface lower than a surface of said connection pad.

6. A board according to claim 5, wherein the recessed portion is formed by removing a surface of said chip mounting portion.

7. A board according to claim 5, further comprising a solder resist covering a surface of said board including said chip mounting portion,
   so that the recessed portion is formed by partially removing said solder resist.

8. A board according to claim 5, further comprising at least one inlet for injecting a sealing resin into a gap between said chip component and said chip mounting portion,
   so that the inlet is formed by partially exposing the recessed portion from an edge of said chip component.

9. A board according to claim 8, wherein two inlets are formed by exposing two ends of the recessed portion from said chip component.

10. A board according to claim 5, further comprising a three-dimensional pattern formed on a bottom portion of the recessed portion.

11. A board according to claim 5, wherein said board comprises a build-up board.

12. A board according to claim 5, further comprising a sealing resin injected into a gap between said chip component connected to said connection pad and said chip mounting portion.

13. A board according to claim 5, wherein said chip component connected to said connection pad comprises a flip chip.

14. A board according to claim 5, wherein said chip component connected to said connection pad comprises a beam lead chip.

15. A chip component mounting structure comprising:
    a chip component mounting board comprising a chip mounting portion on which a chip component is to be mounted, a connection pad formed on said chip mounting portion and electrically connected to said chip component, and a recessed portion formed on said chip mounting portion to oppose at least part of a circuit device surface of said chip component connected to said connection pad, the recessed portion having a bottom surface lower than a surface of said connection pad;
    said chip component mounted on said chip mounting portion on said chip component mounting board; and
    a sealing resin injected into a gap between said chip component mounted on said chip component mounting board and said chip component mounting board including the recessed portion to seal said circuit device surface of said chip component.

16. A method of manufacturing a chip component mounting board, characterized by comprising the steps of:
    forming connection pads on a chip mounting portion on a board in correspondence with an electrode position of said chip component; and
    at least partially forming a recessed portion having a bottom surface lower than a surface of said connection pad inside said connection pads on said chip mounting portion.

* * * * *